United States Patent
Uenohara et al.

(10) Patent No.: US 6,846,685 B2
(45) Date of Patent: Jan. 25, 2005

(54) VERTICAL-CAVITY SURFACE-EMITTING SEMICONDUCTOR LASER

(75) Inventors: Hiroyuki Uenohara, Tokyo (JP); Kouta Tateno, Tokyo (JP); Toshiaki Kagawa, Tokyo (JP); Osamu Tadanaga, Tokyo (JP); Chikara Amano, Tokyo (JP); Takashi Kurokawa, Tokyo (JP)

(73) Assignee: Nippon Telegraph and Telephone Corporation, Tokyo (JP)

( * ) Notice: Subject to any disclaimer, the term of this patent is extended or adjusted under 35 U.S.C. 154(b) by 0 days.

(21) Appl. No.: 10/372,410

(22) Filed: Feb. 25, 2003

(65) Prior Publication Data

US 2003/0156613 A1 Aug. 21, 2003

Related U.S. Application Data

(62) Division of application No. 09/261,465, filed on Feb. 24, 1999, now Pat. No. 6,549,553.

(30) Foreign Application Priority Data

Feb. 25, 1998 (JP) ............................................ 10-043383

(51) Int. Cl.[7] .............................................. H01L 21/00
(52) U.S. Cl. .............................. 438/22; 438/31; 438/39
(58) Field of Search ............................ 438/22, 31, 39, 438/46, 41

(56) References Cited

U.S. PATENT DOCUMENTS

| | | | |
|---|---|---|---|
| 5,212,701 A | 5/1993 | Choquette et al. | |
| 5,530,715 A | 6/1996 | Shieh et al. | |
| 5,577,064 A | 11/1996 | Swirhun et al. | |
| 5,864,575 A | 1/1999 | Ohiso et al. | |
| 6,011,811 A * | 1/2000 | Ohlander et al. | 372/46 |
| 6,259,121 B1 * | 7/2001 | Lemoff et al. | 257/88 |

FOREIGN PATENT DOCUMENTS

| | | |
|---|---|---|
| EP | 0784363 | 7/1997 |
| EP | 0820131 | 2/1998 |
| JP | 1-42879 | 2/1989 |
| JP | 1-264285 | 10/1989 |
| JP | 2-52485 | 2/1990 |
| WO | WO 93/2281 | 11/1993 |

OTHER PUBLICATIONS

Yoo et al., "Transverse Mode Characteristics of Vertical–Cavity Surface–emitting Lasers Buried In Amorphous GaAs Antiguide Layer", IEEE Journal of Quantum Electronics, vol. 33, No. 10, Oct. 1997, pp. 1794–1800.

Chang–Hasnain et al., "Low Threshold Buried Heterostructue Vertical Cavity Surface Emitting Laser", Appl. Phys. Lett. 63 (10) Sep. 6, 1993, pp. 1307–1309.

Lear et al., "High–Frequency Modulation of Oxide–Confined Vertical Cavity Surface Emitting Lasers", Electronics Letters Feb. 29, 1996, vol. 32, No. 5, pp. 457–458.

* cited by examiner

Primary Examiner—Caridad Everhart
(74) Attorney, Agent, or Firm—Venable LLP; Marina V. Schneller

(57) ABSTRACT

A vertical-cavity surface-emitting semiconductor laser has a substrate, a lower DBR structure portion having a plurality of layers provided on the substrate, a semiconductor buried structure portion provided over the lower DBR structure portion having at least one layer with buried therein an active layer, and an upper DBR structure portion having a plurality of layers provided over the semiconductor buried structure portion including the active layer. The active layer, at least one layer arranged over the active layer and at least one layer arranged beneath the active layer constitute an optical resonator region and each of the layers constituting the optical resonator region has an effective refractive index higher than respective effective refractive indices of other layers in the upper and lower DBR structure portions and a refractive index of the at least one layer constituting the semiconductor buried structure portion.

20 Claims, 10 Drawing Sheets

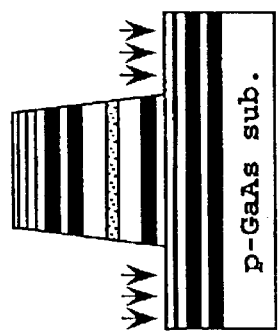
FIG. 3A
IMMEDIATELY AFTER FIRST GROWTH
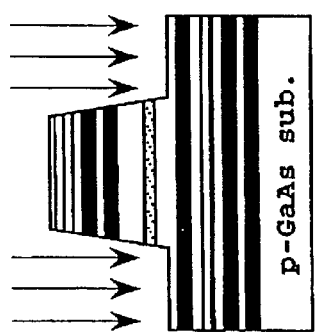
FIG. 3B
MESA FORMATION
FIG. 3C
REGROWTH SURFACING
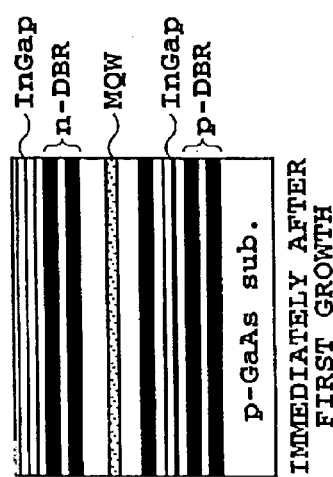
FIG. 3D
(1) SECOND GROWTH (REGROWTH OF CURRENT CONFINEMENT LAYER)
(2) SECOND GROWTH (REGROWTH OF CURRENT CONFINEMENT LAYER)
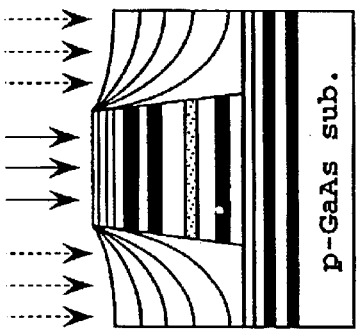
FIG. 3E
ETCHING OF POLYCRYSTAL ON THE MASK
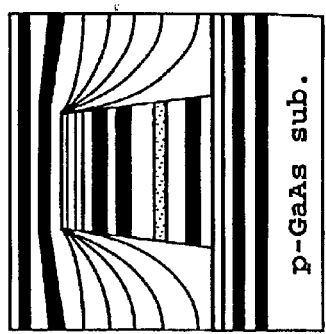
FIG. 3F
THIRD GROWTH (DBR/ELECTRODE REGION GROWTH)
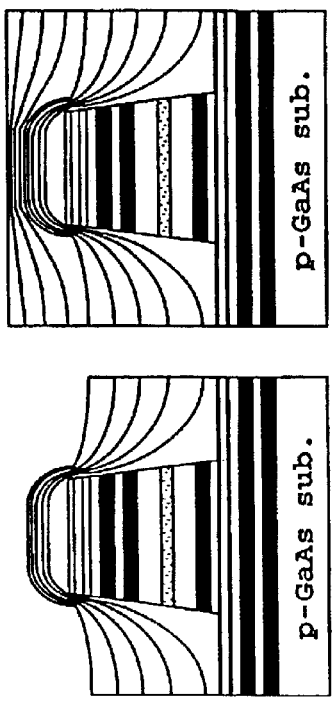

VERTICAL-CAVITY SURFACE-EMITTING SEMICONDUCTOR LASER

This is a divisional of application Ser. No. 09/261,465 filed Feb. 24, 1999 now U.S. Pat. No. 6,549,553.

BACKGROUND OF THE INVENTION

1. Field of the Invention

The present invention relates to a process for fabricating a vertical-cavity surface-emitting semiconductor laser, which is useful as an optical source for optical interconnection that optically connects chips or boards to each other or for conducting two-dimensional parallel signal processing, and to a vertical-cavity surface-emitting semiconductor laser.

2. Description of the Related Art

Vertical-cavity surface-emitting semiconductor lasers, which are easy to construct a two-dimensional array and enables high efficient coupling with fibers without use of lenses for coupling because of their illumination pattern being circular, are considered important as an optical source for optical interconnection or two-dimensional parallel signal processing and also important for the purpose of reducing power consumption because they permit extreme lowering of threshold current by means of an ultrafine-cavity structure.

FIG. 1 is a cross-sectional view showing a conventional vertical-cavity surface-emitting semiconductor laser along the direction vertical to a crystal face thereof (cf. (1) B.-S. Yoo, H. Y. Chu, H.-H. Park, H. G. Lee and J. Lee, IEEE Journal of Quantum Electronics, vol. 33, No. 10, 1997, pp. 1794–1800; and (2) C. Chang-Hasnain, Y. A., Wu, G. S. Li, G. Hasnain, K. D. Choquette, C. Caneau and L. T. Florez, Applied Physics Letters, vol. 63, No. 10, 1993, pp. 1307–1309). The laser of FIG. 1 comprises devices including a p-GaAs substrate 101, which has thereon in order a p-$Al_yGa_{1-y}As/Al_zGa_{1-z}As$ (0<y<z) distributed Bragg reflector (DBR) mirror 102 (the dashed portion showing $Al_zGa_{1-z}As$ and the white portion showing $Al_yGa_{1-y}As$), a non-doped $Al_wGa_{1-w}As$ lower spacer layer 103, a $GaAs/Al_xGa_{1-x}As$ (x≦w) multiple quantum well active layer 104, a non-doped $Al_wGa_{1-w}As$ upper spacer layer 105, an n-$Al_yGa_{1-y}As/Al_zGa_{1-z}As$ (0<y<z) DBR mirror 106, a semiconductor buried layer 107, a lower electrode 108, an insulator 109, an upper electrode 110, and an element separating structure 111. The respective layers of DBR are set to a thickness corresponding to one fourth of the quotient obtained by dividing the lasing wavelength by the refractive index of each layer.

Among the devices shown in FIG. 1, an AlGaAs/AlGaAs n-i-p-i structure or an amorphous GaAs layer has been reported as the buried layer 107, each exhibiting single transverse mode lasing operation. However, the above-described structures do not achieve optical constriction due to refractive index optical waveguide but are of an antiguide waveguide structure. Therefore, in principle, a plurality of transverse modes can occur but not a single transverse mode. In this case, higher order transverse modes are cut off to achieve a single transverse mode operation by utilizing the outer portion of the waveguide having a higher loss. However, in dynamic characteristics in which the carrier density inside the active layer varies widely, there arises the problem that an unstable operation occurs, that is, higher order modes may emerge depending on the carrier density distribution in the active layer.

SUMMARY OF THE INVENTION

A first object of the present invention is to provide a vertical-cavity surface-emitting semiconductor laser which provides single transverse mode operation that is dynamically stable as compared with a conventional vertical-cavity surface-emitting semiconductor laser.

A second object of the present invention is to provide a vertical-cavity surface-emitting semiconductor laser having a smaller element volume than a conventional vertical-cavity surface-emitting semiconductor laser which provides high speed modulation characteristics and provides single transverse mode operation that is dynamically stable as compared with a conventional vertical-cavity surface-emitting semiconductor laser.

A third object of the present invention is to provide a process for fabricating a vertical-cavity surface-emitting semiconductor laser of which transverse mode is single and dynamically more stable than a conventional vertical-cavity surface-emitting semiconductor laser.

A fourth object of the present invention is to provide a process for fabricating a vertical-cavity surface-emitting semiconductor laser having a smaller element volume than a conventional vertical-cavity surface-emitting semiconductor laser which provides high speed modulation characteristics and provides single transverse mode operation that is dynamically stable as compared with a conventional vertical-cavity surface-emitting semiconductor laser.

The above and the other objects, effects, features and advantages of the present invention will become more apparent from the following description of embodiments thereof taken in conjunction with the accompanying drawings.

BRIEF DESCRIPTION OF THE DRAWINGS

FIGS. 3A to 3F are cross-sectional views illustrating respective steps of a process for fabricating the vertical-cavity surface-emitting semiconductor laser element shown in FIG. 2;

DETAILED DESCRIPTION OF THE PREFERRED EMBODIMENTS

Hereafter, the present invention will be described in more detail by embodiments. However, the present invention should not be construed as being limited thereto.

First Embodiment

Figure 1:
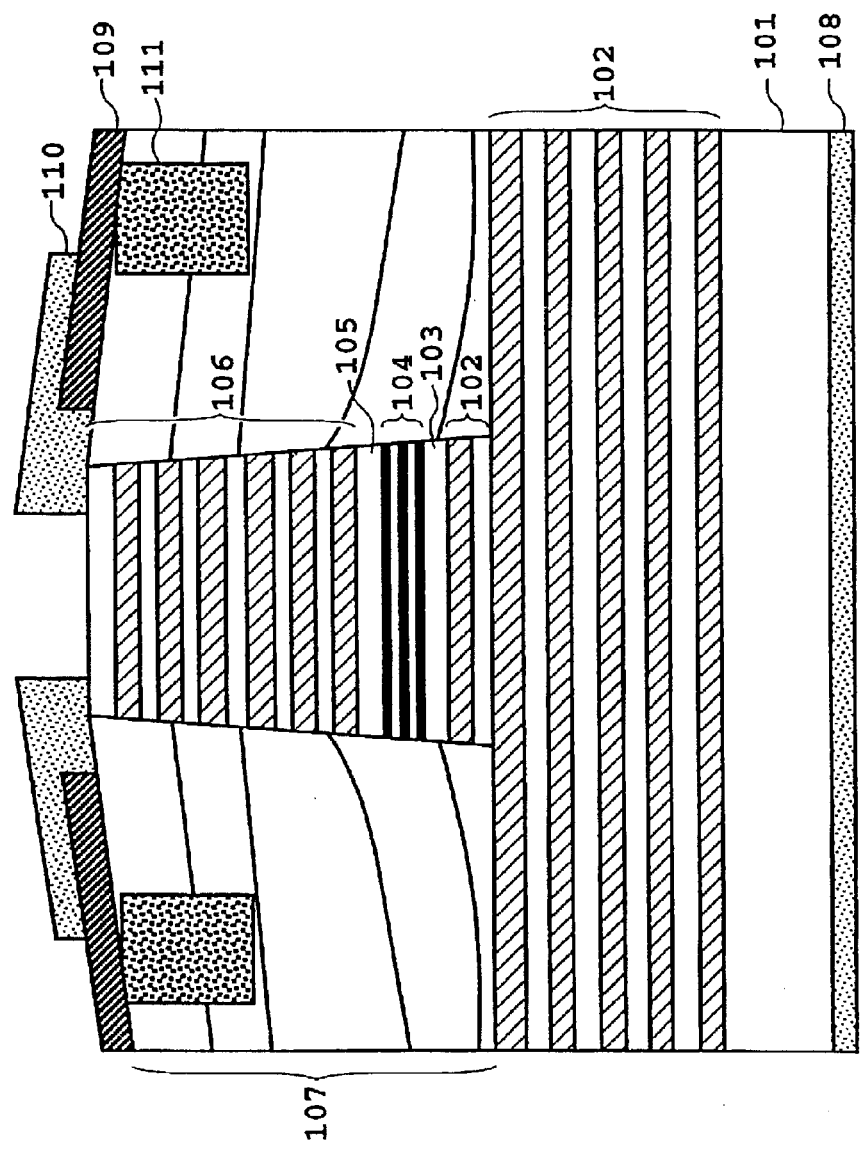
FIG. 1 is a cross-sectional view showing a conventional vertical-cavity surface-emitting semiconductor laser.
Figure 2:
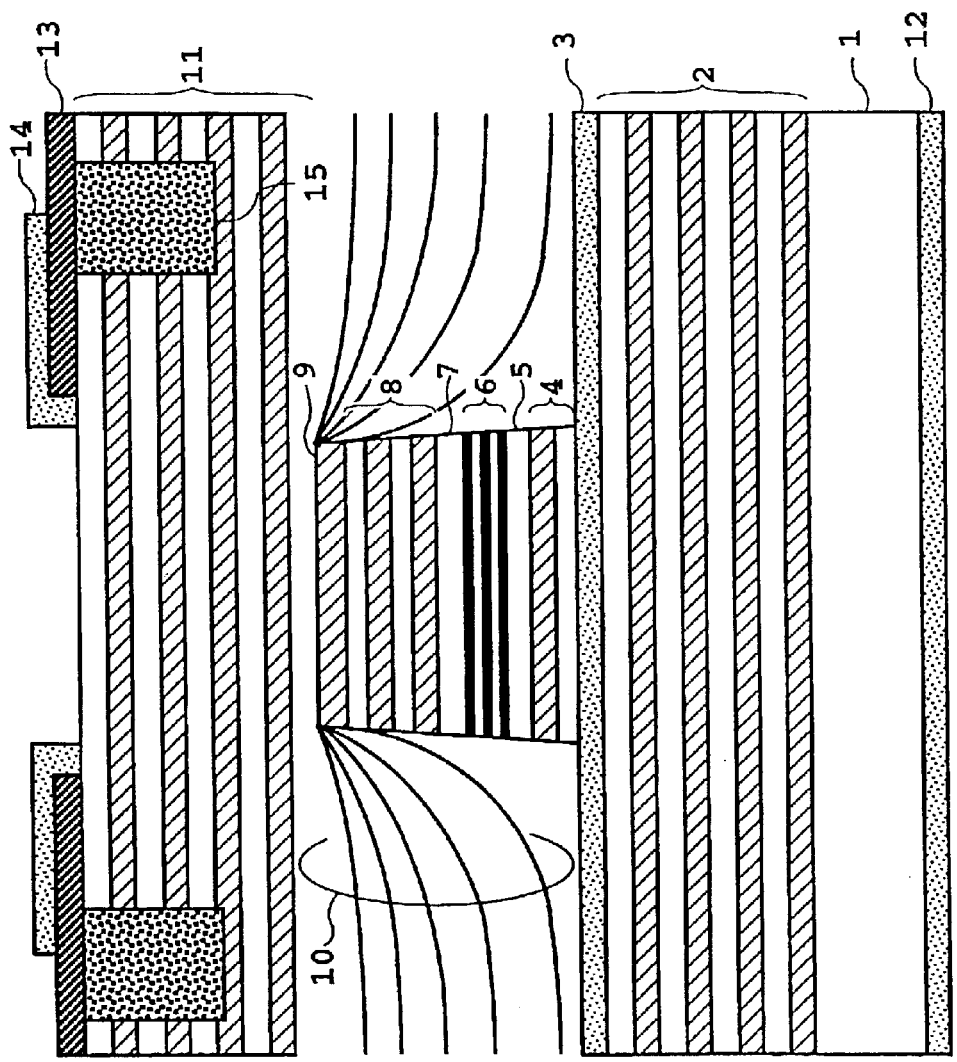
FIG. 2 is a cross-sectional view showing a vertical-cavity surface-emitting semiconductor laser element according to a first embodiment of the present invention along the direction vertical to a plane of crystal growth.

FIG. 2 is a cross-sectional view of a vertical-cavity surface-emitting semiconductor laser element according to a first embodiment of the present invention along the direction vertical to a face of crystal growth. This structure includes a p-GaAs substrate 1, which has thereon in order a p-$Al_yGa_{1-y}As/Al_zGa_{1-z}As$ (0<y<z) distributed Bragg reflector (DBR) mirror 2 (the dashed portion showing $Al_zGa_{1-z}As$ and the white or non-dashed portion showing $Al_yGa_{1-y}As$), a p-InGaP etch stop layer 3, a p-$Al_yGa_{1-y}As/Al_uGa_{1-u}As$ (0<y<u<z) distributed Bragg reflector (DBR) mirror 4 (the dashed portion showing $Al_uGa_{1-u}As$ and the white or non-dashed portion showing $Al_yGa_{1-y}As$), a non-doped $Al_wGa_{1-w}As$ lower spacer layer 5, a $GaAs/Al_xGa_{1-x}As$ multiple quantum well (MQW) active layer 6, a non-doped $Al_wGa_{1-w}As$ upper spacer layer 7, an n-$Al_yGa_{1-y}As/Al_uGa_{1-u}As$ (0<y<u<z) DBR mirror 8 (the dashed portion showing $Al_uGa_{1-u}As$ and the white or non-dashed portion showing $Al_yGa_{1-y}As$), an n-InGaP first growth final layer 9, an AlGaAs or InGaP semiconductor buried layer (second growth layer) 10, an n-$Al_yGa_{1-y}As/Al_zGa_{1-z}As$ (0<y<z) DBR mirror (third growth layer) 11, a lower electrode 12, an insulator 13, an upper electrode 14, and an element separating structure 15. The respective layers of DBR are set to a thickness corresponding to one fourth of the quotient obtained by dividing the lasing wavelength by the refractive index of each layer.

FIGS. 3A to 3F illustrate the steps of crystal growth. First growth starts with a p-DBR since it occurs on a p-GaAs substrate and continues to form an MQW active layer and an n-DBR (or a part thereof) (FIG. 3A). Several periods (the thickness corresponding to the depth in which a mesa is formed in a later step) of high refractive index layer near the active layer of n-DBR and p-DBR are made to have an Al content lower than that of other DBR portions to form a so-called refractive index waveguide, in which the refractive index of a current confinement layer is lower than that of the optical resonator portion. In addition to the composition of AlGaAs having a lower Al content, the same effect can be attained by using InGa(As)P having a refractive index in which an effective refractive index of the optical resonator region is higher than that of the current confinement layer.

In the periods of the DBR structure near the active layer where the Al content is made lower than elsewhere is sufficient for exhibiting the effect of optical confinement when the thickness is larger than the penetration depth into the DBR. Provision of p-InGaP in a portion of the low refractive index layer of p-DBR is to allow it to be used as an etch stop layer. The last layer is n-InGaP. Provision of this layer is intended to use a layer which contains no Al and has less adverse influence of surface oxidation since when AlGaAs constitutes a surface on which regrowth occurs, the influence of a surface oxide layer is significant so that higher Al content makes it more difficult to obtain a high quality layer as a regrowth layer. Next, a mesa structure is formed using an insulator such as a photo resist, $SiO_2$ or the like (FIG. 3B). For the formation of the mesa structure, either of wet etching and dry etching is applicable. The etching is stopped at a depth just above the p-InGaP etch stop layer in view of an optical monitor or etching rate. Thereafter, the surface of p-InGaP is exposed with a selective etchant (FIG. 3C). Using the mask at the time of mesa formation as it is as a selective mask for crystal growth, a second growth is conducted to form a second growth layer (current confinement layer) (FIG. 3D (1)). As the current confinement layer, which is a semiconductor buried layer, there is used an AlGaAs or InGaP layer having a series of doping types of p-n-p-n- . . . in order. The Al content of the AlGaAs current confinement layer is set to 0.33 or more, for example, when the upper and lower DBR's near the active layer are made of $Al_{0.15}Ga_{0.85}As/Al_{0.5}Ga_{0.5}As$. Since the refractive index of InGaP at a wavelength of 0.85 μm is 3.34, a refractive index waveguide structure is formed in the DBR structure having an Al content not exceeding the value as specified above. Alternatively, a high resistivity semi-insulator layer is selected as a first layer of regrowth. In this case, current confinement is more effective. Usually, polycrystal is deposited on the mask as the uppermost layer of the mesa, so that the polycrystal on the laser resonator portion is removed by etching using a photo resist as a mask (FIG. 3E). The removal method may be wet etching, dry etching or combination of these. Alternatively, it is also effective to carry out regrowth to an extent that the height of the step between the mesa portion and the portion other than the mesa portion is about 1000 Å utilizing the tendency that the step is decreased according as the thickness of the grown layer increases (FIG. 3D (2)) and then perform etching uniformly by wet etching or dry etching without any mask until the mask on the mesa is exposed. If the growth condition that polycrystal is not deposited on the mask as the uppermost layer of the mesa is used, the process can be simplified by omitting the etching step shown in FIG. 3E. As the final stage, after the mask over the mesa is removed, a third growth is conducted (FIG. 3F) to allow n-DBR to grow in periods sufficient for obtaining reflectivity which satisfies the laser lasing conditions.

Figure 4:
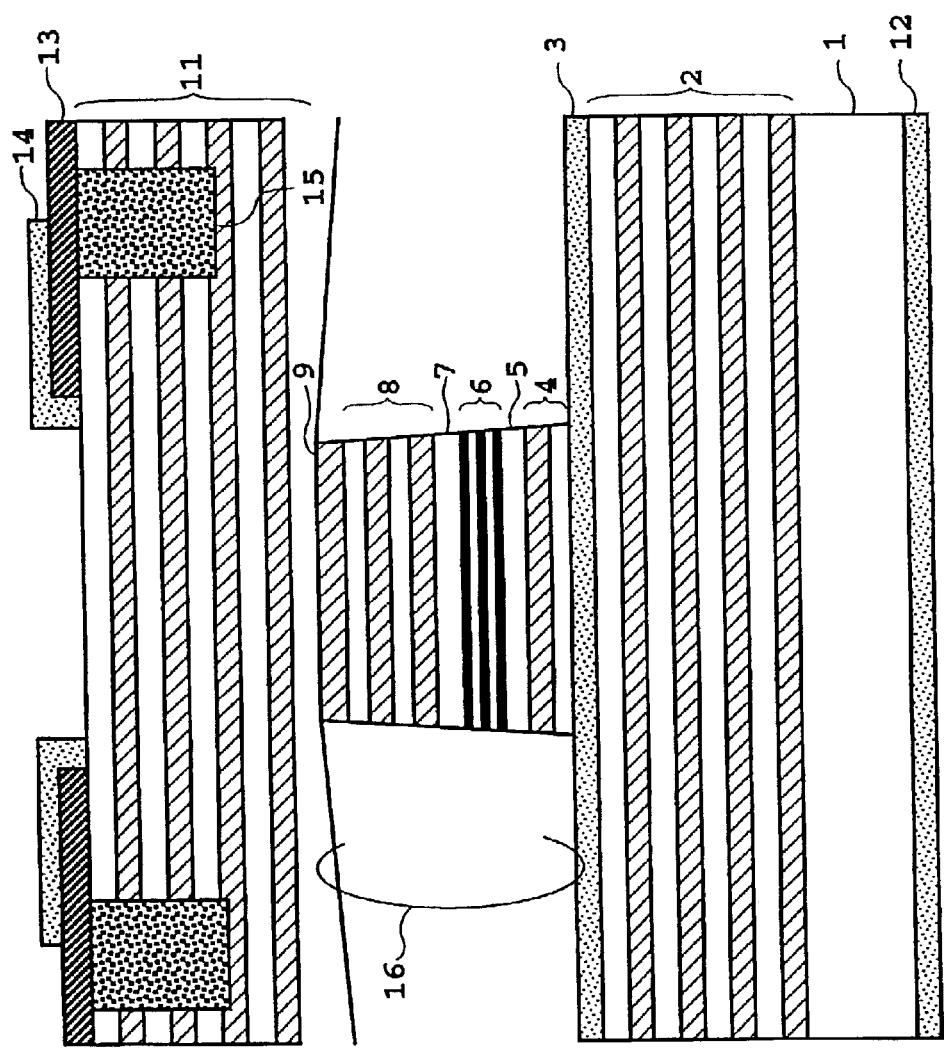
FIG. 4 is a cross-sectional view showing a vertical-cavity surface-emitting semiconductor laser element according to a first embodiment of the present invention along the direction vertical to a plane of crystal growth.

FIG. 4 is a cross-sectional view another example of a vertical-cavity surface-emitting semiconductor laser element according to the instant embodiment along the direction vertical to the face of crystal growth. This structure is not so different from that shown in FIG. 2 but is characterized in that the semiconductor buried layer 16 is formed of a single layer. The composition of the semiconductor buried layer 16 is AlGaAs or InGaP and a metal such as Cr is doped in order to improve high resistivity characteristics. Doping of $O^+$ ions will be more effective.

Figure 5A:
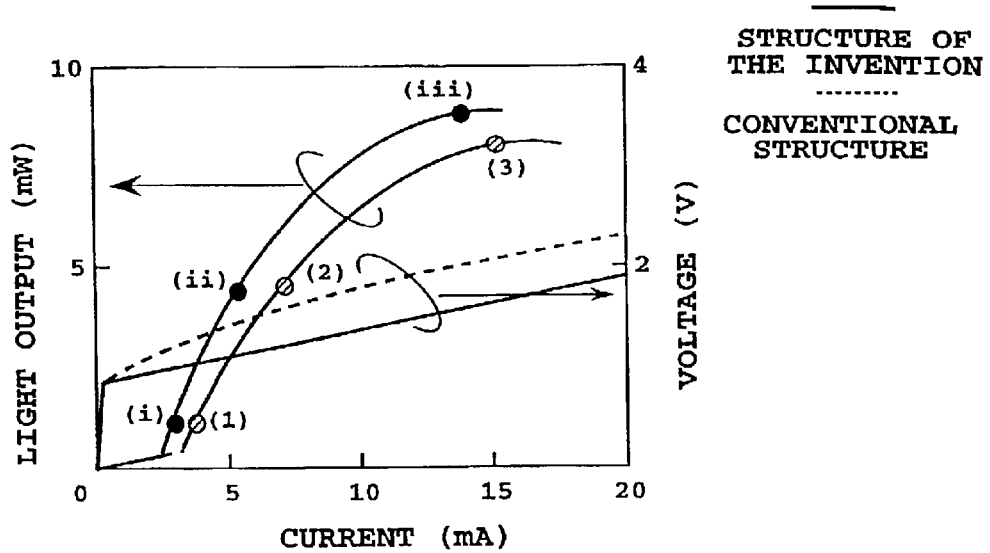
FIGS. 5A and 5B are graphs illustrating the characteristics of a vertical-cavity surface-emitting semiconductor laser fabricated by the process for fabricating a vertical-cavity surface-emitting semiconductor laser element according to a first embodiment of the present invention, FIG. 5A illustrating current-vs.-light output characteristics and current-vs.-voltage characteristics of the vertical-cavity surface-emitting semiconductor laser of the present invention and FIG. 5B illustrating comparison of a far field pattern of emission by a vertical-cavity surface-emitting semiconductor laser of the present invention with that by a conventional vertical-cavity surface-emitting semiconductor laser.
Figure 5B:
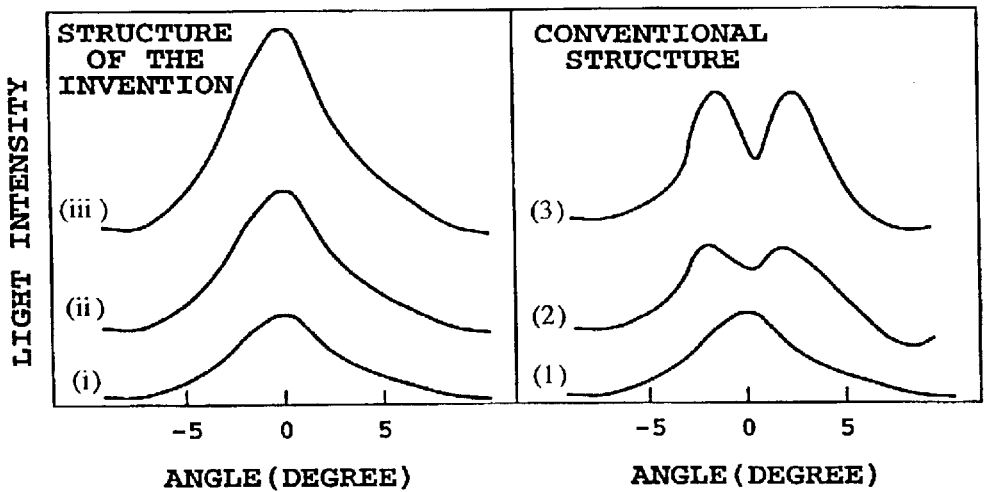

FIGS. 5A and 5B illustrate the characteristics of the vertical-cavity surface-emitting semiconductor laser element shown in FIGS. 2 and 4, respectively. FIG. 5A illustrates the current-vs.-light output characteristics and current-vs.-voltage characteristics. The novel structure of the present invention as indicated in solid line achieves reduction in series resistance due to an increased area of the electrode layer as compared with the conventional structure as indicated in broken line. Since the vertical-cavity surface-emitting semiconductor laser of the instant embodiment is not of a structure which causes loss for higher order modes like anti-guide waveguides but is of a structure which in principle excites a single mode only, the emission components from the active layer are coupled with the lasing mode efficiently so that an increase in efficiency can be realized. Further, since non-emission recombination on the interface of the active layer is suppressed, a decrease in threshold and a further increase in efficiency are realized.

FIG. 5B is a graph illustrating far field patterns (FFP) against different current values. Immediately after the lasing, both the conventional structure ((1)) and the structure of the invention ((i)) show single-lobe patterns, respectively and operate in a fundamental transverse mode. With an increase in current, the conventional structure is dominated by higher order transverse modes having two peaks ((2), (3)) while the structure of the invention maintains a single-lobe pattern.

While the above explanation concerns the structures on a p-GaAs substrate, similar effects can be obtained also in the case of the structures on an n-GaAs substrate. Although the above description is made on the structures including an InGaP etch stop layer but similar effects can be obtained also in the structures including an AlGaAs layer having an Al content different from that of other DBR portions. The case has been explained above where the last layer formed in the first growth being made of InGaP, similar effects can be obtained with an AlGaAs layer having an Al content limited to a lower level. Although the above explanation relates to AlGaAs/GaAs semiconductors, similar effects can be obtained also in InGaAs/GaAs semiconductors.

As described above, in the process for fabricating a vertical-cavity surface-emitting semiconductor laser element and a vertical-cavity surface-emitting semiconductor laser according to the instant embodiment, growth up to a DBR (or a part thereof) above an active layer in a first growth, formation of InGaP or a composition-controlled AlGaAs current confinement layer, i.e., a semiconductor buried layer in a second growth so as to form a refractive index waveguide resonator after formation of a mesa structure, and formation of remaining DBR structures necessary for completing the element, can provide advantageous effects that a vertical-cavity surface-emitting semiconductor laser is formed which operates in a fundamental mode in a stable fashion not only statically but also dynamically and which exhibits low threshold current and low series resistivity and high emission efficiency.

Second Embodiment

Figure 6:
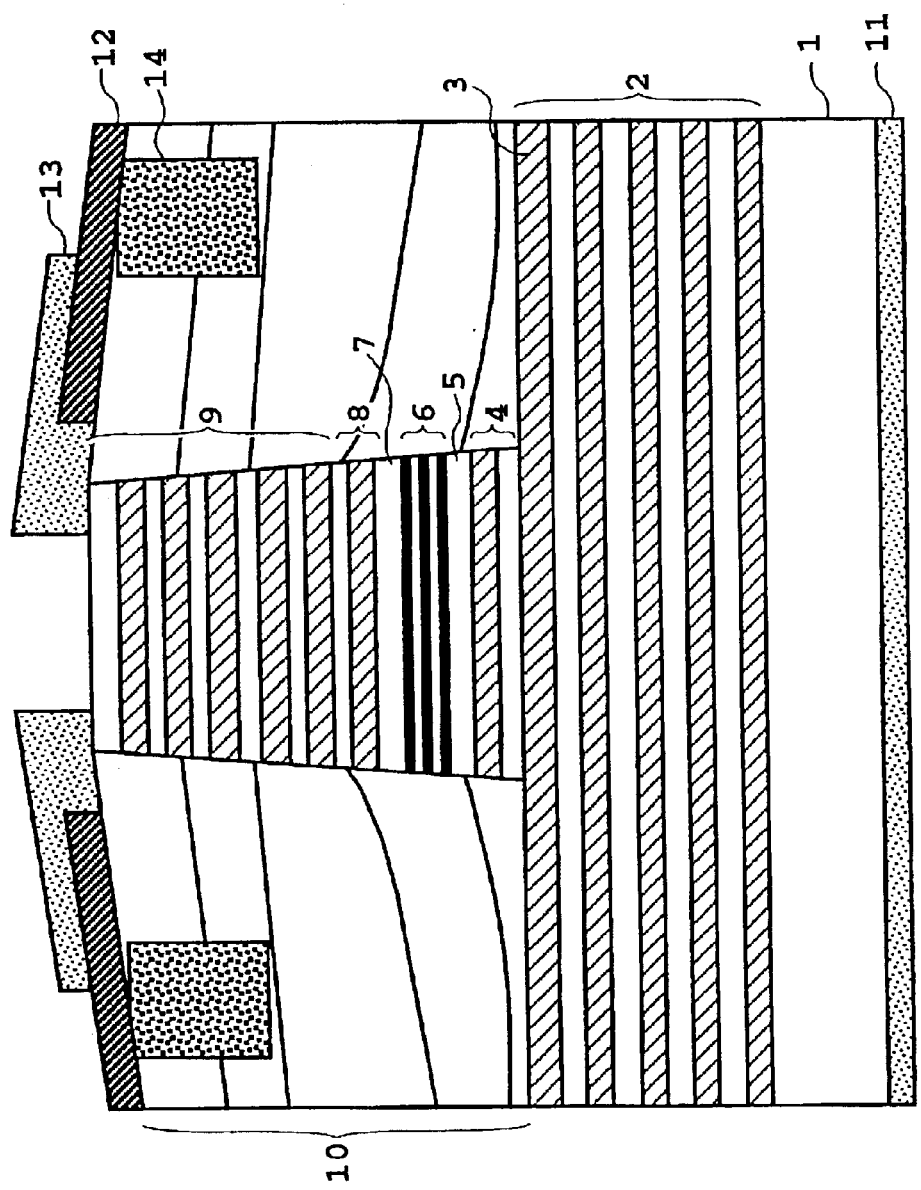
FIG. 6 is a cross-sectional view showing a vertical-cavity surface-emitting semiconductor laser element according to a second embodiment of the present invention along the direction vertical to a plane of crystal growth.

FIG. 6 is a cross-sectional view showing a vertical-cavity surface-emitting semiconductor laser element according to the instant embodiment along the direction vertical to a plane of crystal growth. This structure includes a p-GaAs substrate 1, which has thereon in order a p-$Al_yGa_{1-y}As$/$Al_zGa_{1-z}As$ ($0<y<z$) distributed Bragg reflector (DBR) mirror 2 (the dashed portion showing $Al_zGa_{1-z}As$ and the white or non-dashed portion showing n-$Al_yGa_{1-y}As$), a p-InGaP etch stop layer 3, a p-$Al_yGa_{1-y}As$/$Al_uGa_{1-u}As$ ($0<y<u<z$) distributed Bragg reflector (DBR) mirror 4 (the dashed portion showing $Al_uGa_{1-u}As$ and the white or non dashed portion showing $Al_yGa_{1-y}As$), a non-doped $Al_wGa_{1-w}As$ lower spacer layer 5, a GaAs/$Al_xGa_{1-x}As$ ($0<x<w$) multiple quantum well (MQW) active layer 6, a non-doped $Al_wGa_{1-w}As$ upper spacer layer 7, an n-$Al_yGa_{1-y}As$/$Al_uGa_{1-u}As$ ($0<y<u<z$) DBR mirror 8 (the dashed portion showing $Al_uGa_{1-u}As$ and the white or non-dashed portion showing) $Al_yGa_{1-y}As$, an n-$Al_yGa_{1-y}As$/$Al_zGa_{1-z}As$ ($0<x<z$) DBR mirror 9, an AlGaAs or InGaP semiconductor buried layer 10, a lower electrode 11, an insulator 12, an upper electrode 13, and an element separating structure 14. Of the above-described structures, the layers designated by reference numerals 4 to 8 constitute an optical resonator portion within which electric field components of light are confined. The respective layers of DBR are set to a thickness corresponding to one fourth of the quotient obtained by dividing the lasing wavelength by the refractive index of each layer.

Hereafter, the steps of crystal growth will be described. First growth starts with a p-DBR since it occurs on a p-GaAs substrate and continues to form an MQW active layer and an n-DBR. Several periods (the thickness corresponding to the depth in which a mesa is formed in a later step) of high refractive index layer near the active layer of n-DBR and p-DBR are made to have an Al content lower than that of other DBR portions to form a so-called refractive index waveguide, in which the refractive index distribution after of a current confinement layer is lower than that of the optical resonator portion. In addition to the composition of AlGaAs having a lower Al content, the same effect can be attained by using InGa(As)P having a refractive index in which an effective refractive index of the optical resonator region is higher than that of the current confinement layer. In the periods of the DBR structure near the active layer where the Al content is made lower than elsewhere is sufficient for exhibiting the effect of optical confinement when the thickness is larger than the penetration depth into the DBR. p-InGaP is provided in a portion of the low refractive index layer of p-DBR so that it can be used as an etch stop layer. Provision of this layer is also intended to use a layer which contains no Al and has less adverse influence of surface oxidation since when AlGaAs constitutes a surface on which regrowth occurs, the influence of a surface oxide layer is significant so that higher Al content makes it more difficult to obtain a high quality layer as a regrowth layer. Of course, if the Al content is as low as about 0.1 to about 0.2 and oxidation of the surface does not influence seriously on the regrowth of the crystal, then similar effects can be expected by use of an AlGaAs layer by selection of a suitable etchant in the process step. Next, a mesa structure is formed using an insulator such as a photo resist, $SiO_2$ or the like. For the formation of the mesa structure, either of wet etching and dry etching is applicable. The etching is stopped at a depth just above the p-InGaP etch stop layer in view of an optical monitor or etching rate. Thereafter, the surface of p-InGaP is exposed with a selective etchant. Using the mask at the time of mesa formation as it is as a selective mask for crystal growth, a second growth is conducted to form a second growth layer (current confinement layer). As the current confinement layer, which is a semiconductor buried layer, there is used an AlGaAs or InGaP layer having a series of doping types of p-n-p-n- . . . in order. The Al content of the AlGaAs current confinement layer is set to 0.33 or more, for example, when the upper and lower DBR's near the active layer are made of $Al_{0.15}Ga_{0.85}As/Al_{0.5}Ga_{0.5}As$. Since the refractive index of InGaP at a wavelength of 0.85 µm is 3.34, a refractive index waveguide structure is formed in the DBR structure having an Al content not exceeding the value as specified above. Alternatively, a high resistivity semi-insulator layer is selected as a first layer of regrowth. In this case, current confinement is more effective. In the final stage, the removal of the mask over the mesa is followed by formation of an insulator, opening of a window for flowing current and formation of an electrode, thus completing the element.

Figure 7A:
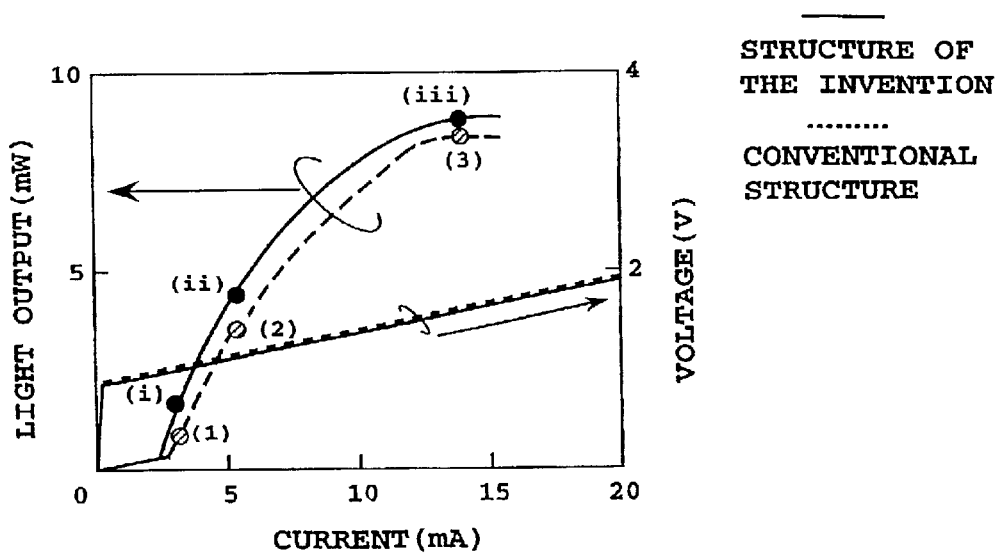
FIGS. 7A and 7B are graphs illustrating the characteristics of a vertical-cavity surface-emitting semiconductor laser fabricated by the process for fabricating a vertical-cavity surface-emitting semiconductor laser element according to a second embodiment of the present invention, FIG. 7A illustrating current-vs.-light output characteristics and current-vs.-voltage characteristics of the vertical-cavity surface-emitting semiconductor laser of the present invention and FIG. 7B illustrating comparison of a far field pattern of emission by a vertical-cavity surface-emitting semiconductor laser of the present invention with that by a conventional vertical-cavity surface-emitting semiconductor laser.
Figure 7B:
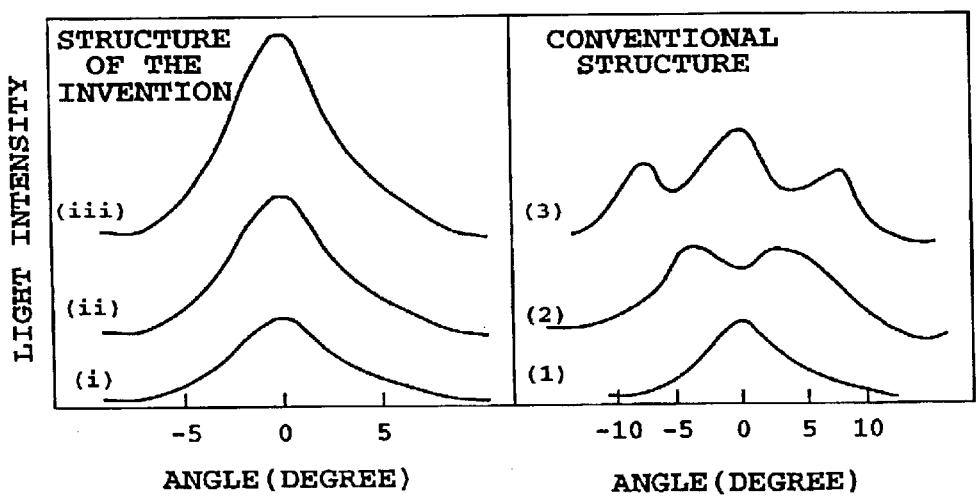

FIGS. 7A and 7B illustrate the characteristics of the vertical-cavity surface-emitting semiconductor laser element shown in FIG. 6. FIG. 7A illustrates the current-vs.-light output characteristics and current-vs.-voltage characteristics. Substantially no difference in resistivity of the element is observed between the conventional structure and the structure of the instant embodiment. Regarding the threshold current, although the reflectivity of DBR can be designed to be the same in the both structures, the structure of the instant embodiment is not of a structure which causes loss for higher order modes like anti-guide waveguides but is of a structure which in principle excites a single mode only so that a decrease in threshold current can be realized and the emission components from the active layer are coupled with the lasing mode efficiently so that an increase in efficiency can be realized. FIG. 7B is a graph illustrating far field patterns (FFP) against different current values. Immediately after the lasing, both the conventional structure ((1)) and the structure of the invention ((i)) show single-lobe patterns, respectively, and operate in a fundamental transverse mode. With an increase in current, the conventional structure is dominated by higher order transverse modes having two lobes ((2), (3)) while the structure of the invention maintains a single-lobe pattern.

While the above explanation concerns the structures on a p-GaAs substrate, similar effects can be obtained also in the case of the structures on an n-GaAs substrate. Although the above description is made on the structures including an InGaP etch stop layer but similar effects can be obtained also in the structures including an AlGaAs layer having an Al content different from that of other DBR portions. The case has been explained above where the last layer formed in the first growth being made of InGaP, similar effects can be obtained with an AlGaAs layer having an Al content limited to a lower level. Although the above explanation relates to AlGaAs/GaAs semiconductors, similar effects can be obtained also in InGaAs/GaAs semiconductors.

As described above, in the vertical-cavity surface-emitting semiconductor laser according to the instant embodiment, designing the buried layer to have an effective refractive index smaller than that of the optical resonator portion can provide advantageous effects that a vertical-cavity surface-emitting semiconductor laser is formed which operates in a fundamental mode in a stable fashion not only statically but also dynamically and which exhibits low threshold current and low series resistivity and high emission efficiency.

Third Embodiment

Figure 8:
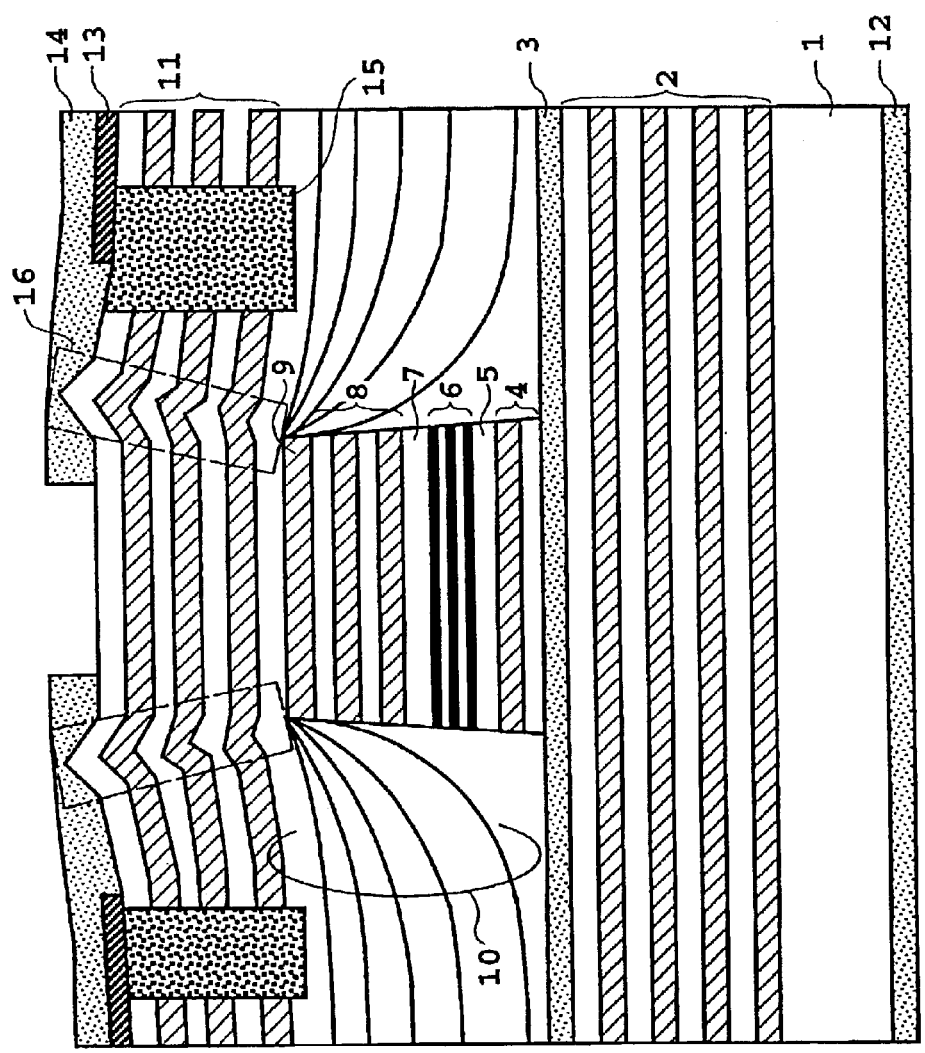
FIG. 8 is a cross-sectional view showing a vertical-cavity surface-emitting semiconductor laser element according to a third embodiment of the present invention along the direction vertical to a plane of crystal growth.

FIG. 8 is a cross-sectional view showing a vertical-cavity surface-emitting semiconductor laser element according to the instant embodiment along the direction vertical to a plane of crystal growth. This structure includes a p-GaAs substrate 1, which has thereon in order a p-$Al_yGa_{1-y}As$/$Al_zGa_{1-z}As$ (0<y<z) distributed Bragg reflector (DBR) mirror 2 (the dashed portion showing $Al_zGa_{1-z}As$ and the white or non-dashed portion showing $Al_yGa_{1-y}As$), a p-InGaP etch stop layer 3, a p-$Al_yGa_{1-y}As$/$Al_uGa_{1-u}As$ (0<y<u<z) distributed Bragg reflector (DBR) mirror 4 (the dashed portion showing $Al_zGa_{1-z}As$ and the white or non-dashed portion showing $Al_yGa_{1-y}As$), a non-doped $Al_wGa_{1-w}As$ lower spacer layer 5, a GaAs/$Al_xGa_{1-x}As$ multiple quantum well (MQW) active layer 6, a non-doped $Al_wGa_{1-w}As$ upper spacer layer 7, an n-$Al_yGa_{1-y}As$/$Al_uGa_{1-u}As$ (0<y<u<z) DBR mirror 8, an n-InGaP last layer 9 in first growth, an AlGaAs or InGaP semiconductor buried layer (second growth layer) 10, an n-$Al_yGa_{1-y}As$/$Al_zGa_{1-z}As$ (0<y<z) DBR mirror (third growth layer) 11, a lower electrode 12, an insulator 13, an upper electrode 14, and an element separating structure 15. The respective layers of DBR are set to a thickness corresponding to one fourth of the quotient obtained by dividing the lasing wavelength by the refractive index of each layer.

Here, the process steps of fabrication of the structure will be described. Formation of the structure shown in FIG. 8 is roughly divided into 3 stages of growth. First growth starts with a DBR on a p-GaAs substrate and continues to form an MQW active layer and an n-DBR (or a part thereof) (corresponding to the structures 2 to 9 in FIG. 8). Several periods (the thickness corresponding to the depth in which a mesa is formed in a later step) of low refractive index layer near the active layer of n-DBR and p-DBR are made to have an Al content lower than that of other DBR portions to form a so-called refractive index waveguide, in which the refractive index of a current confinement layer is lower than that of the optical resonator portion.

p-InGaP is provided in a portion of the low refractive index layer of p-DBR so that it can be used as an etch stop layer. The last layer is made of n-InGaP. Provision of this layer is intended to use a layer which contains no Al and has less adverse influence of surface oxidation since when AlGaAs constitutes a surface on which regrowth occurs, the influence of a surface oxide layer is significant so that higher Al content makes it more difficult to obtain a high quality layer as a regrowth layer. Of course, if the Al content is as low as about 0.1 to about 0.2 and oxidation of the surface does not influence seriously on the regrowth of the crystal, then similar effects can be expected by use of an AlGaAs layer by selection of a suitable etchant in the process step. Next, a mesa structure is formed using an insulator such as a photo resist, $SiO_2$ or the like. For the formation of the mesa structure, either of wet etching and dry etching is applicable. The etching is stopped at a depth just above the p-InGaP etch stop layer in view of an optical monitor or etching rate. Thereafter, the surface of p-InGaP is exposed with a selective etchant. Using the mask at the time of mesa formation as it is as a selective mask for crystal growth, a second growth is conducted to form a second growth layer (current confinement layer, corresponding to the structure 10).

On this occasion, the thickness of growth in a flat portion is purposely set to be lower than the height of the mesa. Then, the mesa is convex with respect to the current confinement layer. Regrowth of the crystal on this shape will generate a transient region 16 which grows at a high rate. Since the flow rate of the dopant upon growth is constant, the region where the growth rate is high has a lower doping concentration than in other regions, which can be reduced to one half or one third by setting the film thickness of the current confinement layer. The resistance in the thickness direction of a semiconductor DBR is sensitive to the doping concentration and a difference in resistivity by one digit or more can be obtained by the variation in the above-described doping concentration. When voltage is applied across the upper and lower electrodes in forward direction, electric fields is effectively concentrated inside the transient region having a high resistivity. Therefore, the contribution of the outer portions of the electrodes to the capacitance of the element is decreased. Since the area of the electrodes remains to be larger than that occupied by the mesa, the resistivity of the element does not increase greatly. Therefore, the element of the instant embodiment has a decreased CR time constant as compared with the conventional structure, thus exhibiting an improvement in high rate modulation characteristics.

As the current confinement layer, which is a semiconductor buried layer, there is used an AlGaAs or InGaP layer having a series of doping types of n-p-n-p- . . . in order. Alternatively, a high resistivity semi-insulator layer is selected as a first layer of regrowth. In this case, current confinement is more effective. Usually, polycrystal is deposited on the mask as the uppermost layer of the mesa, so that the polycrystal on the laser resonator portion is removed by etching using a photo resist as a mask (FIG. 3E). The removal method may be wet etching, dry etching or combination of these. If the growth condition that polycrystal is not deposited on the mask as the uppermost layer of the mesa is used, the process can be simplified by omitting the etching step shown in FIG. 3E. In the final stage, after the removal of the mask over the mesa, a third growth is conducted (corresponding to the structure 11) to grow n-DBR in periods enough to satisfy the lasing conditions.

Figure 9A:
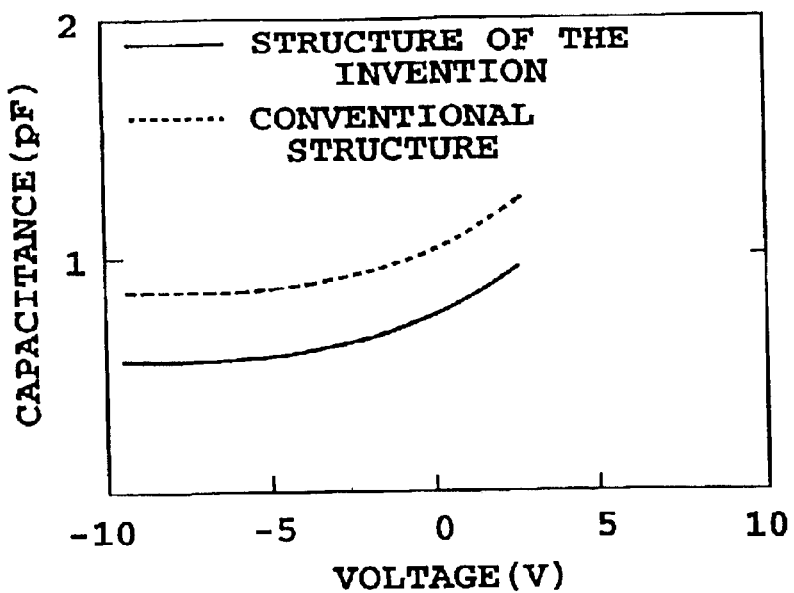
FIGS. 9A and 9B are graphs illustrating the characteristics of a vertical-cavity surface-emitting semiconductor laser fabricated by the process for fabricating a vertical-cavity surface-emitting semiconductor laser element according to a third embodiment of the present invention, FIG. 9A illustrating capacitance-vs.-voltage characteristics and FIG. 9B illustrating modulation response-vs.-modulation frequency characteristics.
Figure 9B:
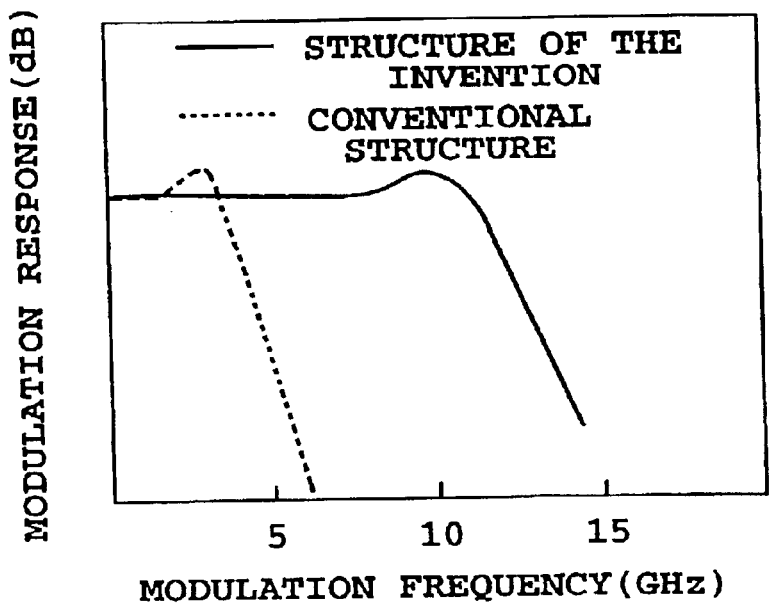
Figure 10:
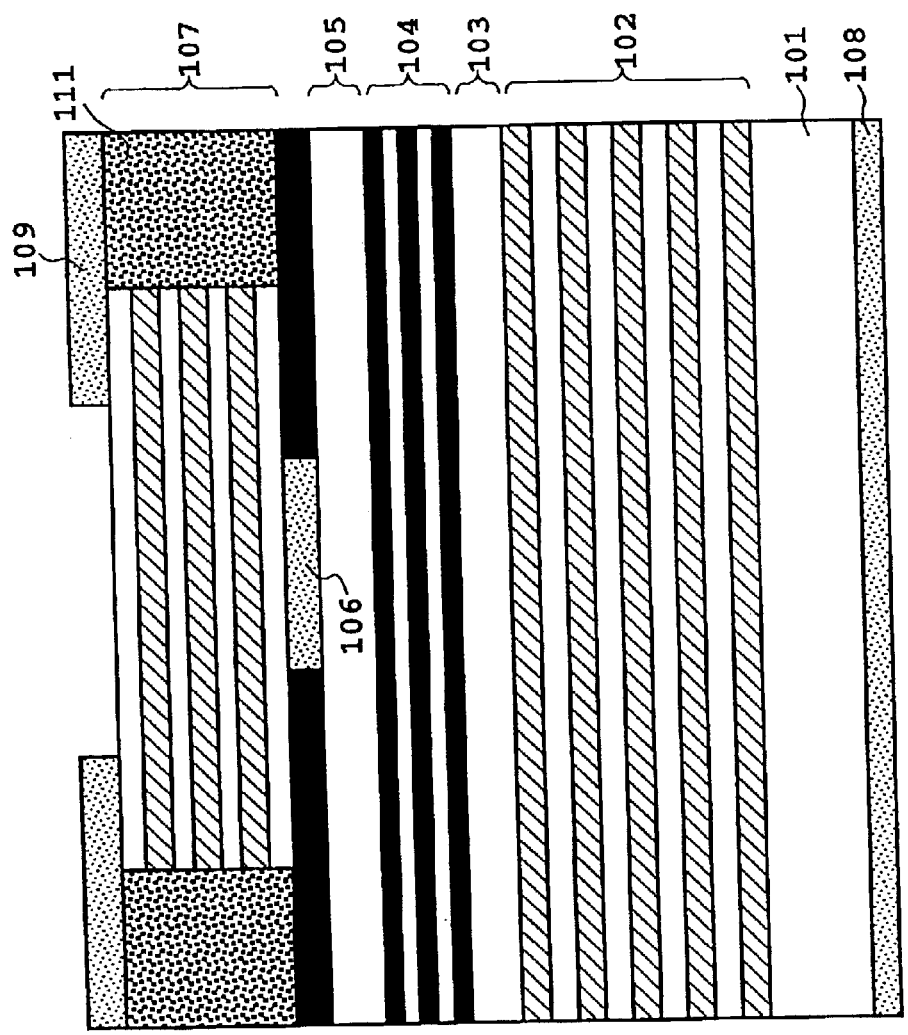
FIG. 10 is a cross-sectional view showing a conventional vertical-cavity surface-emitting semiconductor laser element.

FIGS. 9A and 9B illustrate the characteristics of the vertical-cavity surface-emitting semiconductor laser element shown in FIG. 8. FIG. 9A illustrates the capacitance-vs.-voltage characteristics. In the figure, the present embodiment is shown in solid line, the first embodiment or the conventional structure of FIG. 10 is shown in broken line. The conventional one is of K. L. Lear, et al. Electronics Letters, vol. 32, No. 5, pp. 457–458, 1996.

FIG. 9B is a graph illustrating modulation characteristics. It illustrates how the modulation characteristics are improved by the effect of reduction in the capacitance of the element as illustrated in FIG. 9A.

As described above, this embodiment takes the refractive index waveguide structure as an example. In this embodiment, however, another structure can also have the effect of decreasing the capacitance of the element.

While the above explanation concerns the structures on a p-GaAs substrate, similar effects can be obtained also in the case of the structures on an n-GaAs substrate. Although the above explanation relates to AlGaAs/GaAs semiconductors, similar effects can be obtained also in InGaAs/GaAs semiconductors.

As described above, in the vertical-cavity surface-emitting semiconductor laser of the instant embodiment, growth up to a DBR (or a part thereof) above an active layer in a first growth, formation of a transient region having a high resistivity outside a mesa by setting the thickness of a current confinement layer formed in a second growth after the formation of the mesa to be lower than the height of the mesa, and formation of remaining DBR structures necessary for completing the element in a third growth can provide advantageous effects that a vertical-cavity surface-emitting semiconductor laser is formed which has a decreased capacitance without deteriorating the resistivity of the element substantially and which is improved in high speed modulation.

The present invention has been described in detail with respect to preferred embodiments, and it will now be apparent from the foregoing to those skilled in the art that changes and modifications may be made without departing from the invention in its broader aspects, and it is the intention, therefore, in the appended claims to cover all such changes and modifications as fall within the true spirit of the invention.

What is claimed is:

1. A process for fabricating a vertical-cavity surface-emitting semiconductor laser comprising:

a substrate;

a first lower DBR mirror having a plurality of p-Al $Ga_{1-y}$ As/$Al_zGa_{1-z}$As ($0<v<z$) layers provided on said substrate; and a semiconductor buried structure provided over said first lower DBR mirror and having an optical resonator region with a GaAs/$Al_xGa_{1-x}$As active layer; and a current confinement layer peripherally surrounding the optical resonator region: and a first upper DBR mirror having a plurality of n-$Al_yGa_{1-y}$As/$Al_zGa_{1-z}$As ($0<v<z$) layers provided over said semiconductor buried structure; and wherein said optical resonator region includes said active layer sandwiched between a pair of $Al_wGa_{1-w}$As spacer layers, a p-$Al_yGa_{1-y}$As/$Al_uGa_{1-u}$As ($0<y<u<z$) second lower DBR mirror arranged under one of said spacer layers, and a n-$Al_yGa_{1-y}$As/$Al_uGa_{1-u}$As ($0<y<u<z$) second upper DBR mirror arranged over the other of said spacer layers: and each of said layers and said upper and lower DBR minors constituting said optical resonator region have effective refractive indices higher than the effective refractive index of the current confinement layer; said process comprising:

a first growth step of growing on said substrate said first lower DBR mirror to said optical resonator region or a part of said first upper DBR mirror;

a step of etching to a lower portion of said optical resonator region to form a mesa structure;

a second growth step of forming said current confinement layer; and a third growth step of regrowing said first upper DBR mirror on said semiconductor buried structure; and wherein composition of a mixed crystal is controlled so that each of said layers and said second upper and lower DBR mirrors constituting said optical resonator region have effective refractive indices higher than respective effective refractive indices of the current confinement layer.

2. The process for fabricating a vertical-cavity surface-emitting semiconductor laser as claimed in claim 1, wherein said current confinement layer has a thickness smaller than a height of said optical resonator region.

3. The process for fabricating a vertical-cavity surface-emitting semiconductor laser as claimed in claim 1, wherein said current confinement layer comprises one selected from an n-p repeated laminate structure and a p-n repeated laminate structure.

4. The process for fabricating a vertical-cavity surface-emitting semiconductor laser as claimed in claim 1, wherein said current confinement layer is provided as a structure prepared by laminating one selected from the group consisting of a semi-insulating-n-p repeated laminate structure and a semi-insulating-p-n repeated laminate structure.

5. The process for fabricating a vertical-cavity surface-emitting semiconductor laser as claimed in claim 1, wherein said current confinement layer consists of a semi-insulator layer.

6. The process for fabricating a vertical-cavity surface-emitting semiconductor laser as claimed in claim 1, wherein said current confinement layer comprises a layer doped with an ion.

7. The process for fabricating a vertical-cavity surface-emitting semiconductor laser as claimed in claim 1, wherein said current confinement layer comprises AlGaAs having an effective refractive index lower than that of said optical resonator region.

8. The process for fabricating a vertical-cavity surface-emitting semiconductor laser as claimed in claim 1, wherein said current confinement layer comprises InGaP having an effective refractive index lower than that of said optical resonator region.

9. The process for fabricating a vertical-cavity surface-emitting semiconductor laser as claimed in claim 1, wherein said first lower DBR mirror has at least one layer comprising InGaP having an effective refractive index lower than that of said optical resonator region.

10. The process for fabricating a vertical-cavity surface-emitting semiconductor laser as claimed in claim 1, wherein in said first growth step, said first lower DBR mirror includes a last layer consisting of InGaP.

11. A process for fabricating a vertical-cavity surface-emitting semiconductor laser comprising;
    a substrate;
    a first lower DBR mirror having a plurality of p-$Al_yGa_{1-y}As/Al_zGa_{1-z}As$ (0<y<z) layers provided on said substrate;
    a semiconductor buried structure provided over said first lower DBR mirror and having an optical resonator region with a GaAs/$Al_xGa_{1-x}As$ active layer; and a current confinement layer peripherally surrounding the optical resonator region: and
    a first upper DBR mirror having a plurality of n-$Al_yGa_{1-y}As/Al_zGa_{1-z}As$ (0<y<z) layers provided over said semiconductor buried structure; and
    wherein said optical resonator region includes said active layer sandwiched between a pair of spacer layers, a second lower DBR mirror arranged under one of said spacer layers, and a second upper DBR mirror arranged over the other of said spacer layers: and each of said layers and said upper and lower DBR mirrors constituting said optical resonator region have effective refractive indices higher than the effective refractive index of the current confinement layer; and
    a current conductivity of said first upper DBR mirror over said confinement layer is lower than a current conductivity of said first upper DBR mirror over said optical resonator region;
    a first growth step of growing on said substrate said first lower DBR mirror to said optical resonator region or a part of said first upper DBR mirror;
    a step of etching to a lower portion of said optical resonator region to form a mesa structure portion;
    a second growth step of forming said current confinement layer; and
    a third growth step of regrowing said first upper DBR mirror on said semiconductor buried structure.

12. The process for fabricating a vertical-cavity surface-emitting semiconductor laser as claimed in claim 11, wherein said current confinement layer has a thickness smaller than a height of said optical resonator region.

13. The process for fabricating a vertical-cavity surface-emitting semiconductor laser as claimed in claim 11, wherein said current confinement layer comprises one selected from an n-p repeated laminate structure and a p-n repeated laminate structure.

14. The process for fabricating a vertical-cavity surface-emitting semiconductor laser as claimed in claim 11, wherein said current confinement layer is provided as a structure prepared by laminating one selected from the group consisting of a semi-insulating-n-p repeated laminate structure and a semi-insulating-p-n repeated laminate structure.

15. The process for fabricating a vertical-cavity surface-emitting semiconductor laser as claimed in claim 11, wherein said current confinement layer consists of a semi-insulator layer.

16. The process for fabricating a vertical-cavity surface-emitting semiconductor laser as claimed in claim 11, wherein said current confinement layer comprises a layer doped with an ion.

17. The process for fabricating a vertical-cavity surface-emitting semiconductor laser as claimed in claim 11, wherein said current confinement layer comprises AlGaAs having an effective refractive index lower than that of said optical resonator region.

18. The process for fabricating a vertical-cavity surface-emitting semiconductor laser as claimed in claim 11, wherein said current confinement layer comprises InGaP having an effective refractive index lower than that of said optical resonator region.

19. The process for fabricating a vertical-cavity surface-emitting semiconductor laser as claimed in claim 11, wherein said first lower DBR mirror has at least one layer comprising InGaP having an effective refractive index lower than that of said optical resonator region.

20. The process for fabricating a vertical-cavity surface-emitting semiconductor laser as claimed in claim 11, wherein in said first growth step, said first lower DBR mirror includes a last layer consisting of InGaP.

* * * * *